United States Patent
Wu et al.

(10) Patent No.: US 10,580,514 B2
(45) Date of Patent: *Mar. 3, 2020

(54) PERIODICALLY UPDATING A LOG LIKELIHOOD RATIO (LLR) TABLE IN A FLASH MEMORY CONTROLLER

(71) Applicant: Seagate Technology LLC, Cupertino, CA (US)

(72) Inventors: Yunxiang Wu, Cupertino, CA (US); Yu Cai, San Jose, CA (US); Zhengang Chen, San Jose, CA (US); Erich Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 15/884,133

(22) Filed: Jan. 30, 2018

(65) Prior Publication Data

US 2018/0158536 A1    Jun. 7, 2018

Related U.S. Application Data

(63) Continuation of application No. 14/198,862, filed on Mar. 6, 2014, now Pat. No. 9,916,906.
(Continued)

(51) Int. Cl.
*G11C 29/52*    (2006.01)
*G06F 11/10*    (2006.01)
(Continued)

(52) U.S. Cl.
CPC .......... *G11C 29/52* (2013.01); *G06F 11/1012* (2013.01); *G06F 11/1072* (2013.01);
(Continued)

(58) Field of Classification Search
CPC ... G11C 29/52; G11C 11/5642; G11C 16/349; G11C 29/028; G11C 29/021;
(Continued)

(56) References Cited

U.S. PATENT DOCUMENTS

| | | |
|---|---|---|
| 8,413,029 B2 | 4/2013 | Rauschmayer et al. |
| 8,429,501 B2 | 4/2013 | Tseng et al. |

(Continued)

*Primary Examiner* — James C Kerveros
(74) *Attorney, Agent, or Firm* — Setter Roche LLP; Christian W. Best

(57) ABSTRACT

Log likelihood ratio (LLR) values that are computed in a flash memory controller during read retries change over time as the number of program-and-erase cycles (PECs) that the flash memory die has been subjected to increases. Therefore, in cases where an LLR table is used to provide pre-defined, fixed LLR values to the error-correcting code (ECC) decoding logic of the controller, decoding success and the resulting BER will degrade over time as the number of PECs to which the die has been subjected increases. In accordance with embodiments, a storage system, a flash memory controller for use in the storage system and method are provided that periodically measure the LLR values and update the LLR table with new LLR values. Periodically measuring the LLR values and updating the LLR table with new LLR values ensures high decoding success and a low BER over the life of the flash memory die.

22 Claims, 12 Drawing Sheets

Related U.S. Application Data

(60) Provisional application No. 61/945,268, filed on Feb. 27, 2014.

(51) Int. Cl.

| | | |
|---|---|---|
| *G11C 11/56* | (2006.01) | |
| *G11C 16/34* | (2006.01) | |
| *G11C 29/02* | (2006.01) | |
| *G11C 7/14* | (2006.01) | |
| *G11C 29/50* | (2006.01) | |
| *G11C 29/04* | (2006.01) | |

(52) U.S. Cl.
CPC ........ *G11C 11/5642* (2013.01); *G11C 16/349* (2013.01); *G11C 29/028* (2013.01); *G06F 2212/403* (2013.01); *G11C 7/14* (2013.01); *G11C 29/021* (2013.01); *G11C 29/50004* (2013.01); *G11C 2029/0409* (2013.01); *G11C 2029/0411* (2013.01)

(58) Field of Classification Search
CPC ...... G11C 29/50004; G11C 2029/0409; G11C 7/14; G11C 2029/0411; G06F 11/1012; G06F 11/1072; G06F 2212/403

USPC ........................................................ 714/773
See application file for complete search history.

(56) References Cited

U.S. PATENT DOCUMENTS

| | | |
|---|---|---|
| 8,621,334 B1 | 12/2013 | Varnica et al. |
| 8,665,650 B2 | 3/2014 | Yang |
| 8,966,350 B2 | 2/2015 | Mokhlesi et al. |
| 9,009,574 B2 * | 4/2015 | Chilappagari ...... G06F 11/1048 714/758 |
| 2012/0072805 A1 | 3/2012 | Tseng et al. |
| 2012/0213001 A1 | 8/2012 | Yang |
| 2012/0311402 A1 | 12/2012 | Tseng et al. |
| 2012/0317460 A1* | 12/2012 | Chilappagari ...... G06F 11/1048 714/773 |
| 2013/0145235 A1 | 6/2013 | Alhussein et al. |
| 2014/0040704 A1 | 2/2014 | Wu et al. |
| 2014/0281823 A1 | 9/2014 | Micheloni et al. |
| 2015/0149855 A1 | 5/2015 | Alhussien et al. |
| 2015/0149871 A1* | 5/2015 | Chen .................. G06F 11/1068 714/773 |
| 2016/0266969 A1* | 9/2016 | Jeon .................... G06F 11/1068 |

\* cited by examiner

| NO. OF READS | DECISION PATTERNS FOR LSB OF MLC | | | | | | |
|---|---|---|---|---|---|---|---|
| 1 | | | | | | | 1 |
| 1 | | | | | | | 0 |
| 2 | | | | | | 1 | 1 |
| 2 | | | | | | 0 | 1 |
| 2 | | | | | | 0 | 0 |
| 3 | | | | | 1 | 1 | 1 |
| 3 | | | | | 0 | 1 | 1 |
| 3 | | | | | 0 | 0 | 1 |
| 3 | | | | | 0 | 0 | 0 |
| 4 | | | | 1 | 1 | 1 | 1 |
| 4 | | | | 0 | 1 | 1 | 1 |
| 4 | | | | 0 | 0 | 1 | 1 |
| 4 | | | | 0 | 0 | 0 | 1 |
| 4 | | | | 0 | 0 | 0 | 0 |
| 5 | | | 1 | 1 | 1 | 1 | 1 |
| 5 | | | 1 | 1 | 1 | 1 | 0 |
| 5 | | | 0 | 0 | 1 | 1 | 1 |
| 5 | | | 0 | 0 | 0 | 1 | 1 |
| 5 | | | 0 | 0 | 0 | 0 | 1 |
| 5 | | | 0 | 0 | 0 | 0 | 0 |
| 6 | | 1 | 1 | 1 | 1 | 1 | 1 |
| 6 | | 0 | 1 | 1 | 1 | 1 | 1 |
| 6 | | 0 | 0 | 1 | 1 | 1 | 1 |
| 6 | | 0 | 0 | 0 | 1 | 1 | 1 |
| 6 | | 0 | 0 | 0 | 0 | 1 | 1 |
| 6 | | 0 | 0 | 0 | 0 | 0 | 1 |
| 6 | | 0 | 0 | 0 | 0 | 0 | 0 |
| 7 | 1 | 1 | 1 | 1 | 1 | 1 | 1 |
| 7 | 1 | 1 | 1 | 1 | 1 | 1 | 0 |
| 7 | 1 | 1 | 1 | 1 | 1 | 0 | 0 |
| 7 | 0 | 0 | 0 | 1 | 1 | 1 | 1 |
| 7 | 0 | 0 | 0 | 0 | 1 | 1 | 1 |
| 7 | 0 | 0 | 0 | 0 | 0 | 1 | 1 |
| 7 | 0 | 0 | 0 | 0 | 0 | 0 | 1 |
| 7 | 0 | 0 | 0 | 0 | 0 | 0 | 0 |

FIG. 8

| NO. OF READS | DECISION PATTERNS FOR MSB OF MLC |
|---|---|
| 1 | 0 |
|   | 1 |
| 2 | 0 0 |
|   | 1 0 |
|   | 1 1 |
|   | 0 1 |
| 3 | 0 0 0 |
|   | 1 0 0 |
|   | 1 1 0 |
|   | 1 1 1 |
|   | 0 1 1 |
|   | 0 0 1 |
| 4 | 0 0 0 0 |
|   | 1 0 0 0 |
|   | 1 1 0 0 |
|   | 1 1 1 0 |
|   | 1 1 1 1 |
|   | 0 1 1 1 |
|   | 0 0 1 1 |
|   | 0 0 0 1 |
| 5 | 0 0 0 0 0 |
|   | 1 0 0 0 0 |
|   | 1 1 0 0 0 |
|   | 1 1 1 0 0 |
|   | 1 1 1 1 0 |
|   | 1 1 1 1 1 |
|   | 0 1 1 1 1 |
|   | 0 0 1 1 1 |
|   | 0 0 0 1 1 |
|   | 0 0 0 0 1 |

FIG. 9A

| | | | | | | | |
|---|---|---|---|---|---|---|---|
| | | 0 | 0 | 0 | 0 | 0 | 0 |
| | | 1 | 0 | 0 | 0 | 0 | 0 |
| | | 1 | 1 | 0 | 0 | 0 | 0 |
| | | 1 | 1 | 1 | 0 | 0 | 0 |
| | | 1 | 1 | 1 | 1 | 0 | 0 |
| 6 | | 1 | 1 | 1 | 1 | 1 | 0 |
| | | 1 | 1 | 1 | 1 | 1 | 1 |
| | | 0 | 1 | 1 | 1 | 1 | 1 |
| | | 0 | 0 | 1 | 1 | 1 | 1 |
| | | 0 | 0 | 0 | 1 | 1 | 1 |
| | | 0 | 0 | 0 | 0 | 1 | 1 |
| | | 0 | 0 | 0 | 0 | 0 | 1 |
| | | 0 | 0 | 0 | 0 | 0 | 0 |
| | | 1 | 0 | 0 | 0 | 0 | 0 |
| | | 1 | 1 | 0 | 0 | 0 | 0 |
| | | 1 | 1 | 1 | 0 | 0 | 0 |
| | | 1 | 1 | 1 | 1 | 0 | 0 |
| | | 1 | 1 | 1 | 1 | 1 | 0 |
| 7 | | 1 | 1 | 1 | 1 | 1 | 1 |
| | | 0 | 1 | 1 | 1 | 1 | 1 |
| | | 0 | 0 | 1 | 1 | 1 | 1 |
| | | 0 | 0 | 0 | 1 | 1 | 1 |
| | | 0 | 0 | 0 | 0 | 1 | 1 |
| | | 0 | 0 | 0 | 0 | 0 | 1 | 1 |

FIG. 9B

PERIODICALLY UPDATING A LOG LIKELIHOOD RATIO (LLR) TABLE IN A FLASH MEMORY CONTROLLER

CROSS-REFERENCE TO RELATED APPLICATIONS

This application is a continuation application of co-pending Non-provisional patent application Ser. No. 14/198,862, filed Mar. 6, 2014 and claims the benefit of the filing date of the Provisional Patent Application No. 61/945,268 filed Feb. 27, 2014, the disclosures of which are incorporated herein by reference in their respective entirety.

FIELD OF INVENTION

The invention relates generally to flash memory controllers and, more specifically, to periodically updating log likelihood ratio (LLR) tables that are used in flash memory controllers to perform soft decision decoding.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by target or optimal reference voltages changing over time due to adverse effects of changes in temperature, interference from programming neighboring cells, and numerous erase-program cycles. Errors in detecting stored data values are reflected in the performance measurement known as bit error rate (BER). The use of error-correcting codes (ECCs) can improve BER to some extent, but the effectiveness of ECCs diminishes as improved fabrication processes result in smaller cell features.

As illustrated in FIG. 1, an MLC flash memory has four cell voltage distributions 2, 4, 6 and 8 with four respective mean target cell voltages Vtarget0 12, Vtarget1 14, Vtarget2 16 and Vtarget3 18. Such cell voltage distributions commonly overlap each other slightly, but such overlap is not shown in FIG. 1 for purposes of clarity. During a read operation, to attempt to characterize or detect the two bits of cell data (i.e., the LSB and MSB) a flash memory device (not shown) uses three reference voltages it receives from a flash memory controller (not shown): Vref0 22, Vref1 24 and Vref2 26. More specifically, the flash memory device compares the cell voltage with Vref1 24 to attempt to detect the LSB. If the flash memory device determines that the cell voltage is less than Vref1 24, i.e., within a window 28, then the flash memory device characterizes the LSB as a "1". If the flash memory device determines that the cell voltage is greater than Vref1 24, i.e., within a window 30, then the flash memory device characterizes the LSB as a "0". The flash memory device also compares the cell voltage with Vref0 22 and Vref2 26 to attempt to detect the MSB. If the flash memory device determines that the cell voltage is between Vref0 22 and Vref2 26, i.e., within a window 32, then the flash memory device characterizes the MSB as a "0". If the flash memory device determines that the cell voltage is either less than Vref0 22 or greater than Vref2 26, i.e., within a window 34, then the flash memory device characterizes the MSB as a "1".

The most commonly employed ECCs are hard-decoded codes, such as BCH codes. To improve BER beyond what is commonly achievable with hard-decoded ECCs, flash memory controllers may employ soft-decoded ECCs, such as low density parity check (LDPC) ECCs. Soft decoding is more powerful in correcting errors than hard decoding, but soft input information must be provided to the ECC decoding logic. The ECC decoder soft input information is commonly provided in the form of log likelihood ratio (LLR) information. Since a flash memory device conventionally only provides hard decision outputs, i.e., it characterizes each data bit that it reads as either a "1" bit or a "0" bit in the manner described above, employing soft decoding requires that the flash memory controller generate ECC decoder soft input information.

One method that has been employed for generating ECC decoder soft input information (e.g., LLRs) in an MLC flash memory controller involves computing a function of the reference voltages used to read the memory device and the means and variances of the four cell voltage distributions 2, 4, 6 and 8. A faster method that has been employed for generating ECC decoder soft input information in a flash memory controller has been to map a "1" bit (hard decision) to a first fixed or predetermined value and map a "0" bit (hard decision) to a second fixed or predetermined value. For example, a "1" bit may be mapped to a decimal value of "6", and a "0" bit may be mapped to a decimal value of "−6". Thus, such a flash memory controller's ECC decoding logic would use decimal "6" as soft input information in response to the flash memory device reading a "1" bit and would use decimal "−6" as soft input information in response to the flash memory device reading a "0" bit. The decimal value pair of "+6" and "−6" are still hard decision values in a strict mathematical sense, but it is understood that hard decision values are a special case of soft decision values.

Despite the benefits of employing soft-decoded ECCs, a page read sometimes fails. That is, the BER is so great that ECC decoding logic is unable to correct all erroneous bits. A common method for responding to such a page read failure is known as a "retry" or "read retry." In a read retry, the flash memory controller may adjust the reference voltage that was used to read the page and then try to read the page again using the adjusted reference voltage.

The LLR value obtained from a single read may not be of sufficient quality for successful decoding by the ECC decoding logic of the controller. It is known to perform multiple reads with varying reference voltages in order to obtain more information about the read channel and higher quality LLR values. Generating high quality LLR values is critical to improving the BER of the ECC decoding logic. There are many ways to generate the LLR values. LLR values can be generated on the fly as flash memory is being read or they can be generated offline and stored in LLR tables. If the LLR values are generated on the fly as data is being read from flash memory, they are forwarded to the ECC decoder as soft input information as they are generated and used by the ECC decoder to decode the read data. If the LLR values are generated offline and stored in LLR tables, the LLR values are obtained from the table as the data is read from flash memory and provided to the ECC decoder as soft input information. The ECC decoding logic then uses the LLR values from the LLR table to decode the read data. The LLR values that are contained in the LLR table are typically predefined values that are generated once and permanently loaded into the flash memory controller.

SUMMARY

A data storage system, a flash memory controller for use in the storage system and a method are provided for updating LLR values contained in an LLR table of the flash memory controller. The storage system comprises a host system and a solid state drive (SSD) device that is interfaced with the host system. The host system includes at least one host processor that controls operations of the host system and a host memory device that stores data and computer instructions that are used by the host processor. The SSD device includes a flash memory controller and at least one non-volatile memory (NVM). The NVM includes at least a first flash memory having a plurality of flash cells for storing data. The flash memory controller includes at least a first processor, at least a first ECC module, and at least a first LLR table. The LLR table has a plurality of LLR values stored therein for use by the first ECC module in decoding data read from the NVM. The first processor performs an LLR measurement and update (MAU) algorithm that causes the flash memory controller to measure new LLR values and to replace the LLR values stored in the LLR table with the new LLR values.

The method comprises the following:

in at least a first processor of the flash memory controller, determining whether a command to perform a MAU algorithm has been received; and in the first processor, if a determination is made that a command to perform the MAU algorithm has been received, performing the MAU algorithm to measure new LLR values and to cause existing LLR values stored in a first LLR table of the flash memory controller to be updated with the new LLR values.

In an embodiment where the MAU algorithm is performed in software or firmware, a computer program is provided that comprises instructions for execution by at least a first processor of a flash memory controller to cause the first processor to update a LLR table of the flash memory controller. The computer program is embodied on a non-transitory computer-readable medium and comprises first and second code portions. The first code portion decides whether or not a MAU algorithm is to be performed by the first processor, and the second code portion performs the MAU algorithm if the first code portion decides that the MAU algorithm is to be performed. The second code portion performs the MAU algorithm by measuring new LLR values and causing existing LLR values stored in the LLR table to be updated with the new LLR values.

These and other features and advantages of the invention will become apparent from the following description, drawings and claims.

BRIEF DESCRIPTION OF THE DRAWINGS

FIG. 8 is a table relating number of times the same LSB portion of a flash memory device is read using different reference voltages to ordered sets of decision patterns.

FIG. 9A is a table relating number of times the same MSB portion of a flash memory is read using different reference voltages to ordered sets of decision patterns.

FIG. 9B a continuation of the table of FIG. 9A.

DETAILED DESCRIPTION OF AN ILLUSTRATIVE EMBODIMENT

Figure 1:
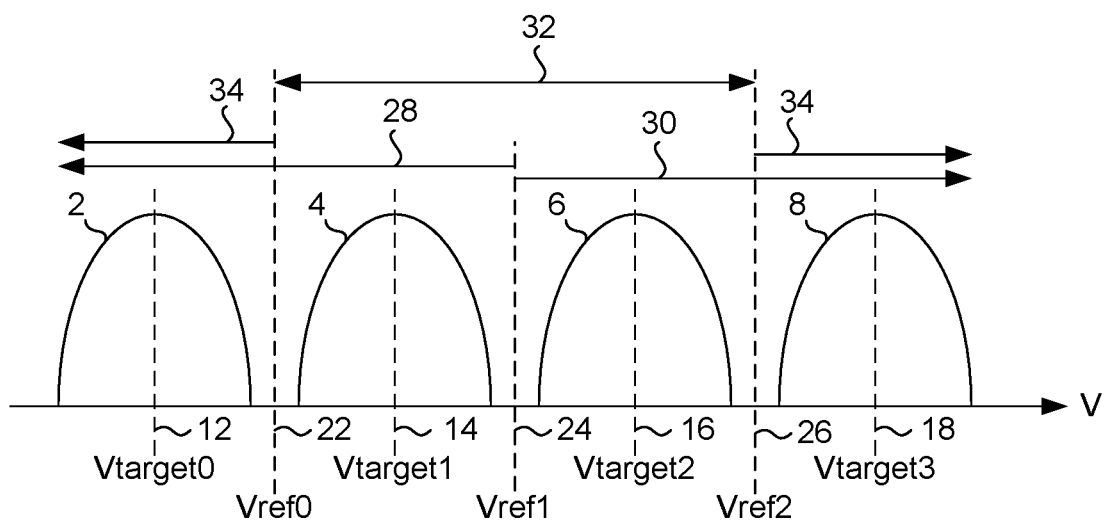
FIG. 1 is a plot of cell voltage distributions in a flash memory device, as known in the art.

In accordance with the invention, it has been determined that the LLR values that are computed in the SSD controller during read retries change over time as the number of program-and-erase cycles (PECs) that the flash memory die has been subjected to increases. Therefore, in cases where an LLR table is used to provide pre-defined, fixed LLR values to the ECC decoding logic, decoding success and the resulting BER will degrade over time as the number of PECs to which the die has been subjected increases. In accordance with illustrative embodiments described herein, a storage system and method are provided that periodically measure the LLR values and update the LLR table with new LLR values. By periodically measuring the LLR values and updating the LLR table with new LLR values, high decoding success and a low BER can be ensured over the life of the flash memory die.

Embodiments of the invention may be implemented in a number of ways, and therefore a few illustrative embodiments are described herein with reference to the figures. Before describing specific illustrative, or exemplary, embodiments for measuring the LLR values and for updating the LLR table with new LLR values, an illustrative embodiment of a storage system in which the invention may be employed will be described with reference to FIGS. 2 and 3. Also, before describing illustrative embodiments for measuring the new LLR values and for updating the LLR table with new LLR values, the manner in which different decision patterns are obtained for various reference voltages used during read retries will be described with reference to FIGS. 4-9B. Finally, illustrative embodiments of the system and methods for measuring new LLR values and for updating the LLR table with the new LLR values will then be described with reference to FIGS. 10A-13. Like reference numerals in the figures identify like features, components or elements throughout the figures and detailed description. Features, components or elements in the figures are not drawn to scale.

Figure 2:
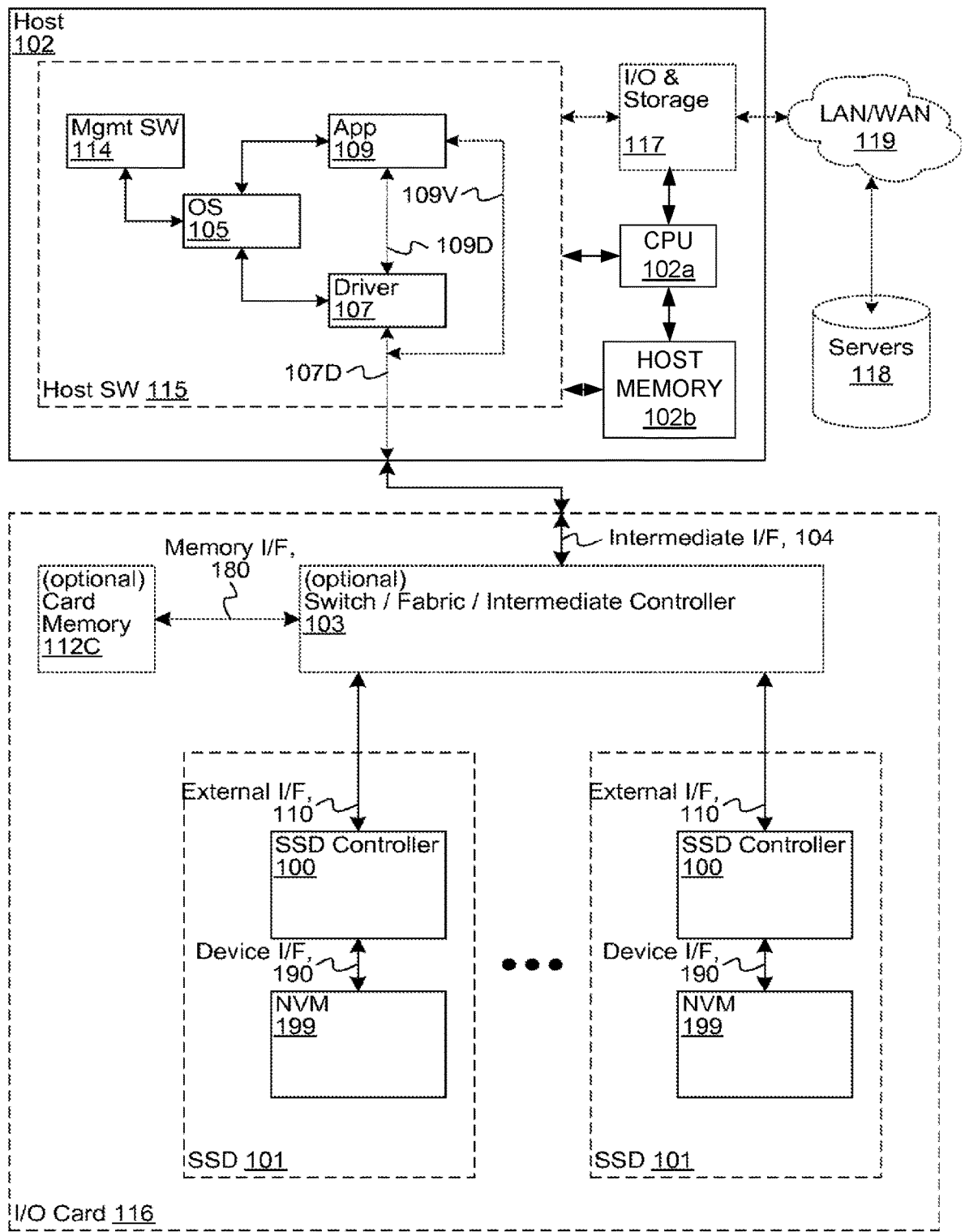
FIG. 2 illustrates a block diagram of a storage system in accordance with an illustrative embodiment that includes one or more instances of an SSD device that is suitable for implementing the invention.

FIG. 2 illustrates a block diagram of a storage system in accordance with an illustrative embodiment that includes one or more instances of a solid state drive (SSD) 101 that implements the invention. The SSD 101 includes an SSD controller 100 coupled to NVM 199 via device interfaces 190. The SSD controller 100 is a flash memory controller and is referred to interchangeably herein as SSD controller 100 and flash memory controller 100. As will be described below in more detail with reference to FIG. 3, the NVM 199 comprises one or more flash memory dies, each of which comprises a plurality of flash cells. The storage system may include, for example, a host system 102, a single SSD 101 coupled directly to the host system 102, a plurality of SSDs 101 each respectively coupled directly to the host system 102 via respective external interfaces, or one or more SSDs 101 coupled indirectly to a host system 102 via various interconnection elements. As an exemplary embodiment of a single SSD 101 coupled directly to the host system 102, one instance of SSD 101 is coupled directly to host system 102 via external interfaces 110 (e.g., switch/fabric/intermediate controller 103 is omitted, bypassed, or passed-through).

As an exemplary embodiment of a plurality of SSDs 101 being coupled directly to the host system 102 via respective external interfaces, each of a plurality of instances of SSD 101 is respectively coupled directly to host system 102 via a respective instance of external interfaces 110 (e.g., switch/fabric/intermediate controller 103 is omitted, bypassed, or passed-through). As an exemplary embodiment of one or more SSDs 101 coupled indirectly to host system 102 via various interconnection elements, each of one or more instances of SSD 101 is respectively coupled indirectly to host system 102 via a respective instance of external interfaces 110 coupled to switch/fabric/intermediate controller 103, and intermediate interfaces 104 coupled to host system 102.

The host system 102 includes one or more processors, such as, for example, one or more microprocessors and/or microcontrollers operating as a central processing unit (CPU) 102a, and a host memory device 102b for storing instructions and data used by the host CPU 102a. Host system 102 is enabled or configured via the host CPU 102a to execute various elements of host software 115, such as various combinations of operating system (OS) 105, driver 107, application 109, and multi-device management software 114. The host software 115 is stored in a memory device 102b of the host system 102 and is executed by the host CPU 102a. Dotted-arrow 107D is representative of host software←→I/O device communication, e.g., data sent/received to/from one or more of the instances of SSD 101 and from/to any one or more of OS 105 via driver 107, driver 107, and application 109, either via driver 107, or directly as a VF.

OS 105 includes and/or is enabled or configured to operate with drivers (illustrated conceptually by driver 107) for interfacing with the SSD. Various versions of Windows (e.g., 95, 98, ME, NT, XP, 2000, Server, Vista, and 7), various versions of Linux (e.g., Red Hat, Debian, and Ubuntu), and various versions of MacOS (e.g., 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101.

Some drives and/or drivers have pass-through modes to enable application-level programs, such as application 109 via optimized NAND Access (sometimes termed ONA) or direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of application←→I/O device communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of application←→I/O device communication (e.g. bypass via a VF for an application), e.g. a DNA-enabled application and a DNA-enabled driver communicating with an SSD, such as without the application using the OS or the driver as intermediaries.

Some of the embodiments that include switch/fabric/intermediate controller 103 also include card memory 112C coupled via memory interface 180 and accessible by the SSDs 101. In various embodiments, one or more of the SSDs 101, the switch/fabric/intermediate controller 103, and/or the card memory 112C are included on a physically identifiable module, card, or pluggable element (e.g., I/O Card 116). In some embodiments, SSD 101 (or variations thereof) corresponds to a SAS drive or a SATA drive that is coupled to an initiator operating as host system 102.

In some embodiments lacking the switch/fabric/intermediate controller, the SSD 101 is coupled to the host system 102 directly via external interfaces 110. In various embodiments, SSD Controller 100 is coupled to the host system 102 via one or more intermediate levels of other controllers, such as a RAID controller. In some embodiments, SSD 101 (or variations thereof) corresponds to a SAS drive or a SATA drive and switch/fabric/intermediate controller 103 corresponds to an expander that is in turn coupled to an initiator, or alternatively switch/fabric/intermediate controller 103 corresponds to a bridge that is indirectly coupled to an initiator via an expander. In some embodiments, switch/fabric/intermediate controller 103 includes one or more PCIe switches and/or fabrics.

In various embodiments, such as some of the embodiments where host system 102 is a computing host (e.g., a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g., via optional I/O & Storage Devices/Resources 117 and optional LAN/WAN 119) with one or more local and/or remote servers (e.g., optional servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a memory stick storage component, and an xD-picture card storage component.

In various embodiments, all or any portions of an SSD controller (or a computing-host flash memory controller), or functions thereof, are implemented in a host that the controller is to be coupled with (e.g., host system 102). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof.

Figure 3:
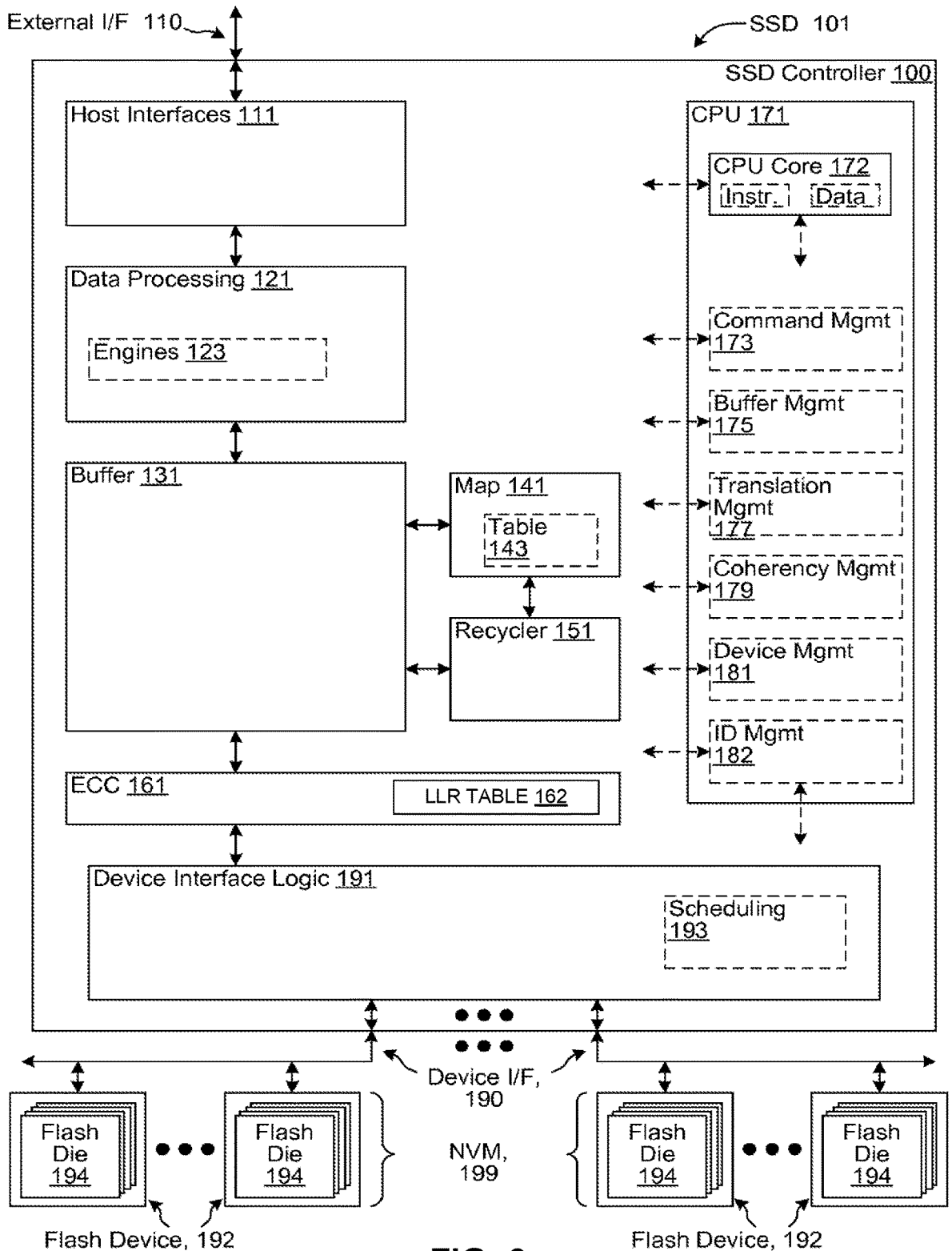
FIG. 3 illustrates a block diagram of an illustrative embodiment of one of the SSDs shown in FIG. 2 including the SSD controller shown in FIG. 2.

FIG. 3 illustrates a block diagram of an illustrative embodiment of one of the SSDs 101 shown in FIG. 2 including the SSD controller 100 shown in FIG. 2 and flash memory dies 194 of NVM 199. Prior to describing an illustrative embodiment of the method that the SSD controller 100 performs to generate new LLR values and to update the LLR table with the new LLR values, the configuration of the SSD controller 100 that is suitable for performing the methods will be described with reference to FIG. 3.

SSD controller 100 is communicatively coupled via one or more external interfaces 110 to the host system 102 (FIG. 2). According to various embodiments, external interfaces 110 are one or more of: a SATA interface; a SAS interface; a PCIe interface; a Fibre Channel interface; an ethernet interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to NVM 199, which includes one or more flash devices 192. According to various illustrative embodiments, device interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each flash memory device 192 includes one or more individual flash dies 194. According to type of a particular one of flash devices 192, a plurality of the flash dies 194 in the particular flash memory device 192 is optionally and/or selectively accessible in parallel. Flash memory device 192 is merely representative of one type of storage device enabled to communicatively couple to SSD controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, device interfaces 190 are organized as: one or more busses with one or more of flash memory device 192 per bus; one or more groups of busses with one or more of flash memory device 192 per bus, where busses in a group are generally accessed in parallel; or any other organization of one or more of flash memory device 192 onto device interfaces 190.

The SSD controller 100 typically, but not necessarily, has one or more modules, such as, for example, host interfaces module 111, data processing module 121, buffer module 131, map module 141, recycler module 151, ECC module 161, Device interface logic module 191, and CPU 171. The specific modules and interconnections illustrated in FIG. 3 are merely representative of one embodiment, and many arrangements and interconnections of some or all of the modules, as well as additional modules not illustrated, are possible, and fewer than all of the modules shown in FIG. 3 may be included in the SSD controller 100. In a first example, in some embodiments, there are two or more host interfaces 111 to provide dual-porting. In a second example, in some embodiments, data processing module 121 and/or ECC module 161 are combined with buffer module 131. In a third example, in some embodiments, Host interfaces module 111 is directly coupled to buffer module 131, and data processing module 121 optionally and/or selectively operates on data stored in buffer module 131. In a fourth example, in some embodiments, device interface logic module 191 is directly coupled to buffer module 131, and ECC module 161 optionally and/or selectively operates on data stored in buffer module 131.

Host interfaces module 111 sends and receives commands and/or data via external interfaces 110. For example, the commands include a read command specifying an address (such as a logical block address (LBA)) and an amount of data (such as a number of LBA quanta, e.g., sectors) to read; in response the SSD 101 provides read status and/or read data. As another example, the commands include a write command specifying an address (such as an LBA) and an amount of data (such as a number of LBA quanta, e.g., sectors) to write; in response the SSD 101 provides write status and/or requests write data and optionally subsequently provides write status. For yet another example, the commands include a de-allocation command (e.g., a trim command) specifying one or more addresses (such as one or more LBAs) that no longer need be allocated.

According to various embodiments, one or more of: data processing module 121 optionally and/or selectively processes some or all data sent between buffer module 131 and external interfaces 110; and data processing module 121 optionally and/or selectively processes data stored in buffer module 131. In some embodiments, data processing module 121 uses one or more engines 123 to perform one or more of: formatting; reformatting; transcoding; and any other data processing and/or manipulation task.

Buffer module 131 stores data sent to/from external interfaces 110 from/to device interfaces 190. In some embodiments, buffer module 131 additionally stores system data, such as some or all map tables, used by SSD controller 100 to manage one or more of the flash devices 192. In accordance with an illustrative embodiment, buffer module 131 includes an MSB page buffer portion 131a and an LSB page buffer portion 131b, which are typically portions of the local memory of the SSD controller 100 that have been allocated for use as temporary storage for storing MSB and LSB page data to be written to flash cells of the flash die 194. The buffer module 131 typically, but not necessarily, also includes a direct memory access (DMA) engine (not shown) that is used to control movement of data to and/or from the Buffer module 131 and ECC-X engine (not shown) that is used to provide higher-level error correction and/or redundancy functions.

According to various embodiments, ECC module 161 optionally and/or selectively processes some or all data sent between buffer module 131 and device interfaces 190. ECC module 161 optionally and/or selectively processes data stored in buffer module 131. In some embodiments, ECC module 161 is used to provide lower-level error correction and/or redundancy functions in accordance with one or more ECC techniques. In some embodiments, ECC module 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC module 161 includes one or more decoders (such as LDPC decoders). As will be described below in more detail, when read data is transferred via device interface 190 from the flash cells of the flash memory dies 194 to the SSD controller 100, the ECC module 161 uses LLR values obtained from an LLR table 162 of the EEC module 161 to decode the read data. Although the LLR table 162 is shown as residing in the ECC module 161, the LLR table 162 may reside at some other location inside of the SSD controller 100, such as in buffer module 131. In accordance with an illustrative embodiment, the CPU 171 of the flash memory controller 100 performs algorithms that measure new LLR values and that update the LLR table 162 with the new values. These algorithms are described below in detail with reference to FIGS. 11-13.

Device interface logic module 191 controls instances of flash memory device 192 via device interfaces 190. Device interface logic module 191 is enabled to send data to/from the instances of flash memory device 192 according to a protocol of flash memory device 192. Device interface logic module 191 typically includes scheduling logic 193 that selectively sequence controls instances of flash memory device 192 via device interfaces 190. For example, in some embodiments, scheduling logic 193 is enabled to queue operations to the instances of flash memory device 192, and to selectively send the operations to individual ones of the instances of flash memory device 192 (or flash die 194) as individual ones of the instances of flash memory device 192 (or flash die 194) become available.

Map module 141 converts between data addressing used on external interfaces 110 and data addressing used on device interfaces 190, using table 143 to map external data addresses to locations in NVM 199. For example, in some embodiments, map module 141 converts LBAs used on external interfaces 110 to block and/or page addresses targeting one or more flash die 194, via mapping provided by table 143. In some embodiments, map module 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; NVM (such as flash memory); cache memory; on-chip memory; off-chip memory; and any combination of the foregoing.

In some embodiments, recycler module 151 performs garbage collection. For example, in some embodiments, instances of flash memory device 192 contain blocks that must be erased before the blocks are re-writeable. Recycler module 151 is enabled to determine which portions of the instances of flash memory device 192 are actively in use (e.g., allocated instead of de-allocated), such as by scanning a map maintained by map module 141, and to make unused (e.g., de-allocated) portions of the instances of flash memory device 192 available for writing by erasing them. In further embodiments, recycler module 151 is enabled to move data stored within instances of flash memory device 192 to make larger contiguous portions of the instances of flash memory device 192 available for writing.

In some embodiments, instances of flash memory device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from recycler module 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD controller 100. CPU module 171 typically includes CPU Core 172, which is, according to various embodiments, one or more single-core or multi-core processors. The individual processor cores in CPU core 172 are, in some embodiments, multi-threaded. CPU core 172 includes instruction and/or data caches and/or memories. For example, the instruction memory contains instructions to enable CPU core 172 to execute programs (e.g., software sometimes called firmware) to control SSD Controller 100. In some embodiments, some or all of the firmware executed by CPU core 172 is stored on instances of flash memory device 192.

In various embodiments, CPU 171 further includes: command management logic 173 for tracking and controlling commands received via external interfaces 110 while the commands are in progress; buffer management logic 175 for controlling allocation and use of buffer module 131; translation Management logic 177 for controlling map module 141; coherency management module 179 for controlling consistency of data addressing and for avoiding conflicts such as between external data accesses and recycle data accesses; device management logic 181 for controlling device interface logic 191; identity management logic 182 for controlling modification and communication of identity information, and optionally other management units. None, any, or all of the management functions performed by CPU 171 are, according to various embodiments, controlled and/or managed by hardware, by software (such as firmware executing on CPU core 172 or on host system 102 (FIG. 2) connected via external interfaces 110), or any combination thereof.

In various embodiments, all or any portions of an SSD Controller 100 are implemented on a single IC, a single die of a multi-die IC, a plurality of dice of a multi-die IC, or a plurality of ICs. The SSD controller 100 and one or more of the flash devices 192 may be implemented on the same die, although they are typically implemented on separate dies.

Figure 4:
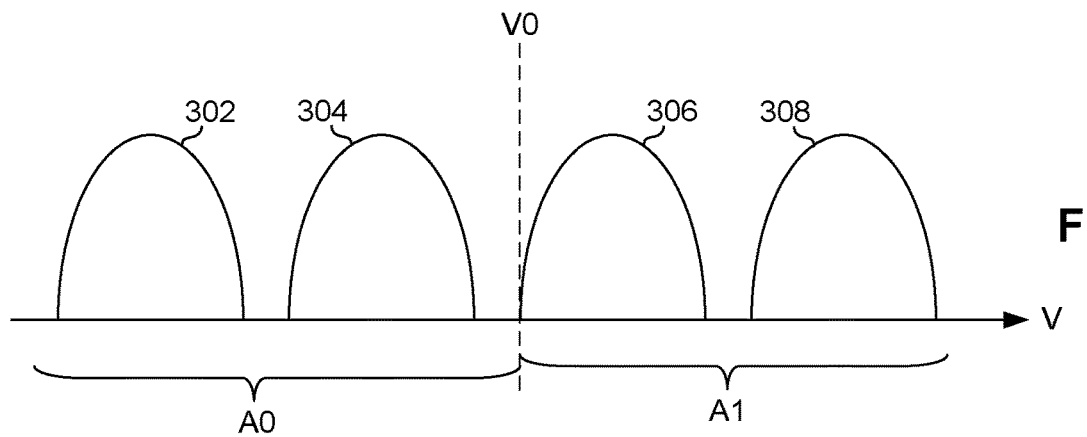
FIG. 4 is a plot of flash memory cell voltage distributions and one reference voltage used in the exemplary method in relation to reading the LSBs of memory cells in an MLC flash memory device.

FIG. 4 is a plot of flash memory cell voltage distributions 302, 304, 306, and 308 and one reference voltage V0 used in the exemplary method in relation to reading the LSBs of memory cells in an MLC flash memory device. As illustrated in FIG. 4, in an instance in which SSD controller 100 effects a single read operation on a single cell of flash memory device 192 using a reference voltage V0, voltage windows A0 and A1 serve as the criteria by which flash memory device 192 detects or makes a hard decision as to the value of the least-significant bit (LSB). In such an instance, flash memory device 192 outputs a hard decision value of "1" for the read data (LSB) if the cell voltage is less than V0, i.e., in the voltage range or decision region A0, and outputs a hard decision value of "0" if the cell voltage is greater than V0, i.e., in the voltage range or decision region A1. Thus, for the ordered set of decision regions {A0, A1} there is an ordered set of corresponding decision patterns {1, 0}. It should be noted that each decision pattern corresponds to a decision region bordering one of the reference voltages.

Figure 5:
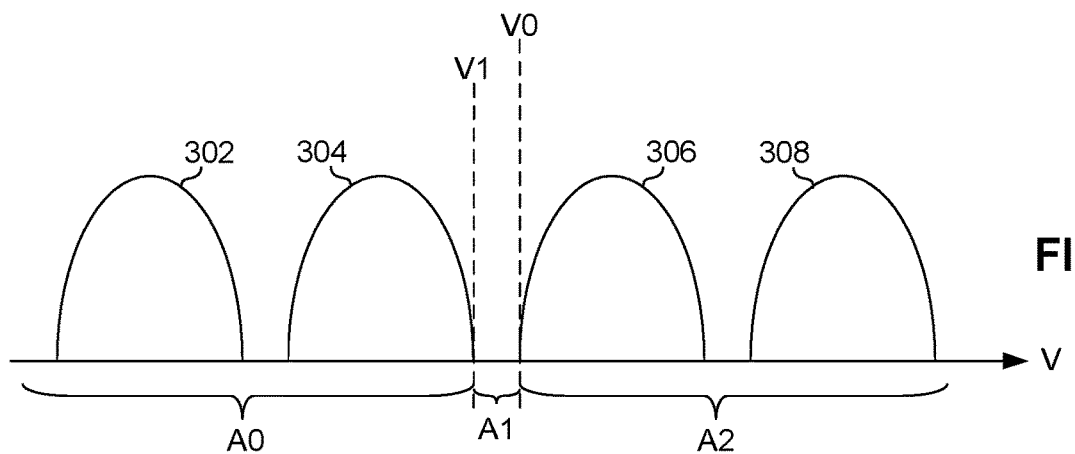
FIG. 5 is a plot of flash memory cell voltage distributions and two reference voltages used in the exemplary method in relation to reading the LSBs of memory cells in an MLC flash memory device.

FIG. 5 is a plot of flash memory cell voltage distributions 302, 304, 306 and 308 and two reference voltages V0 and V1 used in the exemplary method in relation to reading the LSBs of memory cells in an MLC flash memory device. As illustrated in FIG. 5, in an instance in which SSD controller 100 effects two read operations on a single cell of flash memory device 192 using two reference voltages V0 and V1, respectively, decision regions A0, A1 and A2 serve as the criteria by which flash memory device 192 detects or makes a hard decision as to the value of the LSB. A first reference voltage V0 is used to read a cell, and a second reference voltage V1 that is incrementally less than V0 is used to read the same cell.

If the cell voltage is less than V0 and in the decision region A0, then the hard decision value that flash memory device 192 outputs for the read data (LSB) produced in response to the use of the first reference voltage V0 is a "1", and the hard decision value that flash memory device 192 outputs for the read data (LSB) produced in response to the use of the second reference voltage V1 is a "1". If the cell voltage is between V0 and V1, i.e., in the voltage range or decision region A1, then the hard decision value that flash memory device 192 outputs for the read data (LSB) produced in response to the use of the first reference voltage V0 is a "0", and the hard decision value that flash memory device 192 outputs for the read data (LSB) produced in response to the use of the second reference voltage V1 is a "1". If the cell voltage is greater than V1 and in the decision region A2, then the hard decision value that flash memory device 192 outputs for the read data (LSB) produced in response to the use of the first reference voltage V0 is a "0", and the hard decision value that flash memory device 192 outputs for the read data (LSB) produced in response to the use of the second reference voltage V1 is a "0".

Thus, for the ordered set of decision regions {A0, A1, A2} there is an ordered set of three corresponding two-bit decision patterns {11, 01, 00}. The left bit in each two-bit decision pattern corresponds to the use of the first reference voltage V0, and the right bit in each two-bit decision pattern corresponds to the use of the second reference voltage V1. Note that each decision pattern corresponds to a decision region bordering one of the reference voltages.

Figure 6:
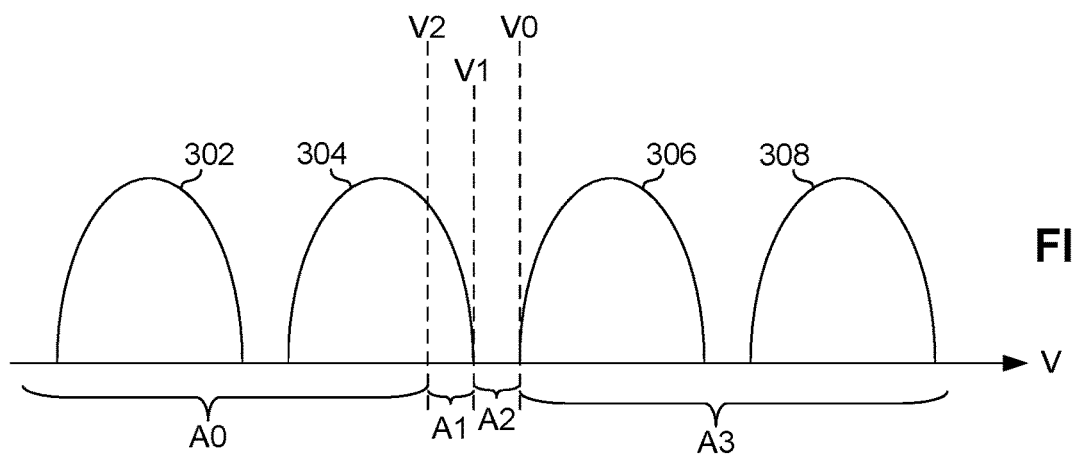
FIG. 6 is a plot of flash memory cell voltage distributions and three reference voltages used in the exemplary method in relation to reading the LSBs of memory cells in an MLC flash memory device.

FIG. 6 is a plot of flash memory cell voltage distributions 302, 304, 306 and 308 and three reference voltages V0, V1 and V2 used in the exemplary method in relation to reading the LSBs of memory cells in an MLC flash memory device. As illustrated in FIG. 6, in an instance in which SSD controller 100 effects three read operations on a single cell of flash memory device 192 using three reference voltages V0, V1 and V2, respectively, decision regions A0, A1, A2 and A3 serve as further criteria by which flash memory device 192 detects or makes a hard decision as to the value of the LSB. A first reference voltage V0 is used to read a cell, a second reference voltage V1 that is incrementally less than V0 is used to read the same cell, and a third reference voltage V2 that is incrementally less than V1 is also used to read the same cell.

If the cell voltage is less than V0 and in the voltage range or decision region A0, then the hard decision value that flash memory device 192 outputs for the read data (LSB) produced in response to the use of the first reference voltage V0 is a "1", the hard decision value that flash memory device 192 outputs for the read data (LSB) produced in response to the use of the second reference voltage V1 is a "1", and the hard decision value that flash memory device 192 outputs for the read data (LSB) produced in response to the use of the third reference voltage V2 is a "1". If the cell voltage is between V1 and V2, i.e., in the voltage range or decision region A1, then the hard decision value that flash memory device 192 outputs for the read data (LSB) produced in response to the use of the first reference voltage V0 is a "0", the hard decision value that flash memory device 192 outputs for the read data (LSB) produced in response to the use of the second reference voltage V1 is a "1", and the hard decision value that flash memory device 192 outputs for the read data (LSB) produced in response to the use of the third reference voltage V2 is a "1". If the cell voltage is between V1 and V0, i.e., in the voltage range or decision region A2, then the hard decision value that flash memory device 192 outputs for the read data (LSB) produced in response to the use of the first reference voltage V0 is a "0", the hard decision value that flash memory device 192 outputs for the read data (LSB) produced in response to the use of the second reference voltage V1 is a "0", and the hard decision value that flash memory device 192 outputs for the read data (LSB) produced in response to the use of the third reference voltage V2 is a "1". If the cell voltage is greater than V2 and in the voltage range or decision region A3, then the hard decision value that flash memory device 192 outputs for the read data (LSB) produced in response to the use of the first reference voltage V0 is a "0", the hard decision value that flash memory device 192 outputs for the read data (LSB) produced in response to the use of the second reference voltage V1 is a "0", and the hard decision value that flash memory device 192 outputs for the read data (LSB) produced in response to the use of the third reference voltage V2 is a "0".

Thus, for the ordered set of decision regions {A0, A1, A2} there is an ordered set of four corresponding three-bit decision patterns {111, 011, 001, 000}. The leftmost decision value in each three-bit decision pattern corresponds to the use of the first reference voltage V0, the middle decision value in each three-bit decision pattern corresponds to the use of the second reference voltage V1, and the rightmost decision value in each three-bit decision pattern corresponds to the use of the third reference voltage V2. Note that each decision pattern corresponds to a voltage region bordering one of the reference voltages.

Although exemplary instances are described above with regard to FIGS. 4, 5 and 6 in which SSD controller 100 uses one, two and three reference voltages, respectively, to read data from flash memory device 192, it should be understood that SSD controller 100 can use any other number of reference voltages. In all such instances, the reference voltages span a range, which can be substantially centered between the target cell voltages specified by the manufacturer of flash memory device 192 for reference voltage distributions 104 and 106, as these target cell voltages generally approximate the means of cell voltage distributions 104 and 106. Also, it should be noted that a suitable voltage increment or delta between successive voltages in the sequence (i.e., the width of each voltage region) such as between V0 and V1, between V1 and V2, between V2 and V3, etc., readily can be determined (e.g., empirically) by one skilled in the art. Although for purposes of illustration in the exemplary embodiment the voltage delta is uniform, in other embodiments there can be non-uniform or different voltage deltas between different pairs of adjacent reference voltages. Also, although for purposes of illustration in the exemplary embodiment the reference voltage is decremented such that successive voltages in the sequence are incrementally less than each other, in other embodiments the reference voltages can be incremented or decremented. A sequence could even alternate or otherwise vary between a voltage greater than a value centered between target cell voltages and a voltage less than that value. For example: {0.4V, −0.1V, −0.05V, 0.1V, 0.3V}, where "0" represents the center between target cell voltages.

Figure 7:
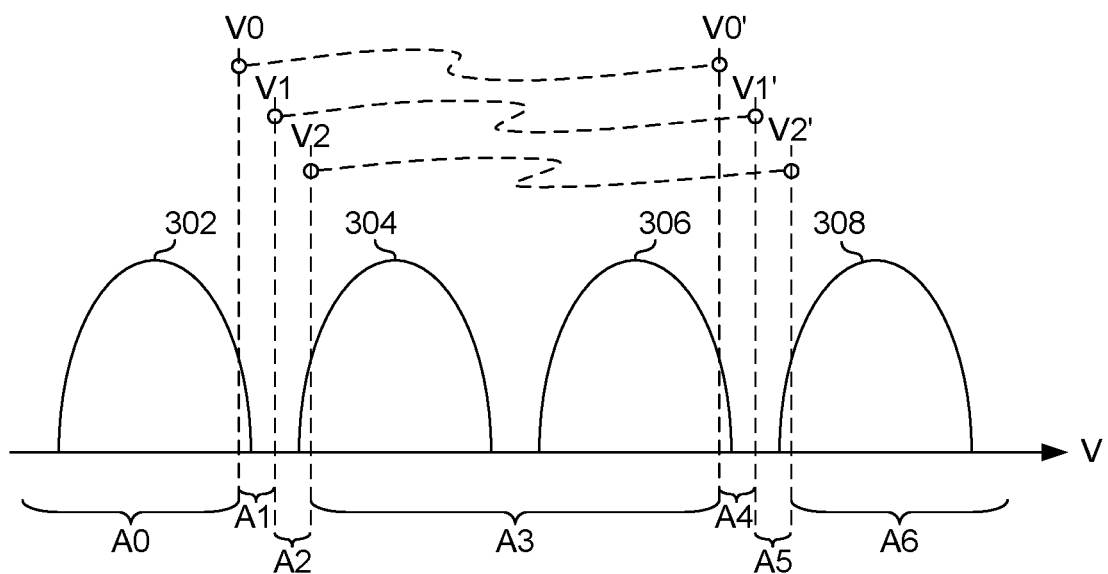
FIG. 7 is a plot of flash memory cell voltage distributions and three reference voltages used in the exemplary method in relation to reading the MSBs of memory cells in an MLC flash memory device.

FIG. 7 is a plot of flash memory cell voltage distributions 302, 304, 306, and 308 and three reference voltages pairs three reference voltage pairs V0/V0', V1/V1' and V2/V2' used in the exemplary method in relation to reading the MSBs of memory cells in an MLC flash memory device. The same principle described above with regard to decision patterns for the LSB stored in a cell of MLC flash memory device 192 applies to decision patterns for the MSB stored in a cell of MLC flash memory device 192. As illustrated in FIG. 6, in an instance in which SSD controller 100 effects three read operations on a single cell of flash memory device 192 using three reference voltage pairs V0/V0', V1/V1' and V2/V2', respectively, decision regions A0, A1, A2, A3, A4, A5 and A6 serve as criteria for detecting the MSB stored in a cell. Each cell is read three times in this example. A first pair of reference voltages V0 and V0' are used to read a cell, a second pair of reference voltages V1 and V1' are used to read the same cell, and a third pair of reference voltages V2 and V2' are also used to read the same cell. The second voltage in each pair can be greater than the first voltage by a fixed amount or increment that readily can be determined (e.g., empirically) by one skilled in the art. For the ordered set of seven decision regions {A0, A1, A2, A3, A4, A5, A6}, there is an ordered set of seven corresponding three-bit decision patterns {111, 011, 001, 000, 100, 110, 111}. It should be noted that since Gray coding is used, the same decision pattern that corresponds to decision region A0 also corresponds to decision region A6. The leftmost decision value in each three-bit decision pattern corresponds to the use of the first pair of reference voltages V0 and V0', the middle decision value in each three-bit decision pattern corresponds to the use of the second pair of reference voltages V1 and V1', and the rightmost decision value in each three-bit decision pattern corresponds to the use of the third pair of reference voltages V2 and V2'. As in the examples described above, in this example each decision pattern corresponds to a voltage region bordering one of the reference voltages.

FIGS. 8 and 9A-B together make up a table containing decision patterns corresponding to decision regions for up to seven read operations performed on the same portion of one of the flash memory devices 192. For N reads of the LSB, where N can be any number from one to seven, the table portion of FIG. 8 includes the corresponding N+1 decision patterns. Similarly, for N reads of the MSB, where N can be any number from one to seven, the table portion of FIGS.

9A-9B includes the corresponding 2N decision patterns. Each ordered set of decision patterns shown in FIGS. 8-9B follows a Gray code pattern.

The above-described exemplary instance in which two read operations are performed using two different reference voltages is reflected in the table of FIG. 8 where the table indicates that a set of two reads of the LSB yields the three decision patterns {11, 01, 00}. The above-described exemplary instance in which three read operations are performed using three different reference voltages is also reflected in the table of FIG. 8 where the table portion indicates that a set of three reads of the LSB yields the four decision patterns {111, 011, 001, 000}. The table of FIG. 8 further indicates the decision patterns that four, five, six and seven reads of the LSB yield. Likewise, the table portion of FIGS. 9A and 9B indicates the decision patterns that one, two, three, four, five, six and seven reads of the MSB yield. As will be described below with respect to FIGS. 10A-11, the decision patterns that result from using different reference voltages to read the flash memory device 192 are used to construct a histogram, which is then used to obtain new LLR values that are then stored in LLR table 162 (FIG. 3).

The initial LLR values contained in the LLR table 162 (FIG. 3) can be generated in a number of ways, as will be understood by those of skill in the art. The LLR vs. PEC behavior of flash memory dies 194 can vary from die to die due to variations in the processes that are used to make the dies 194. Therefore, such process variations should be taken into account in choosing the method for generating the initial LLR values. The following description of the illustrative embodiments for measuring the new LLR values and for updating the LLR table 162 assume that initial LLR values are contained on the LLR table 162, regardless of the manner in which the initial LLR values are obtained or generated.

In accordance with an illustrative embodiment, a histogram method is used to quickly and efficiently measure the new LLR values. The flash memory die 194 will typically be in an idle mode during the performance of the histogram method. Because the new LLR values are measured values rather than predicted or estimated values, assumptions regarding cell voltage Gaussian distributions, which can lead to decoding errors, do not need to be made. By using the new, measured LLR values, decoding failures are reduced, which leads to improved BER and to the storage system having better reliability and longer endurance.

In general, the histogram method is performed as follows. A bit pattern having a known number of 0 bits and 1 bits is written to a selected portion of the flash memory device 1. The positions of the 1 bits and 0 bits in the bit pattern are known to the SSD controller 100. Such a bit pattern is sometimes referred to as a genie bit pattern, and will be referred to herein as such. The selected portion comprises a region (e.g., pages or blocks) of one of the flash memory dies 194, where each region comprises a predetermined number of flash cells (e.g., 10,000 cells). The selected portion is then read with a plurality of reference voltages, such as, for example, reference voltages V0 through V5. As described above, each of the reference voltages V0 through V5 has particular decision regions and particular respective decision patterns associated with it. The decision patterns that are obtained for each of the reference voltages are used to construct one or more histograms. The resulting histogram (s) is then used to generate the new LLR values.

Figure 10A:
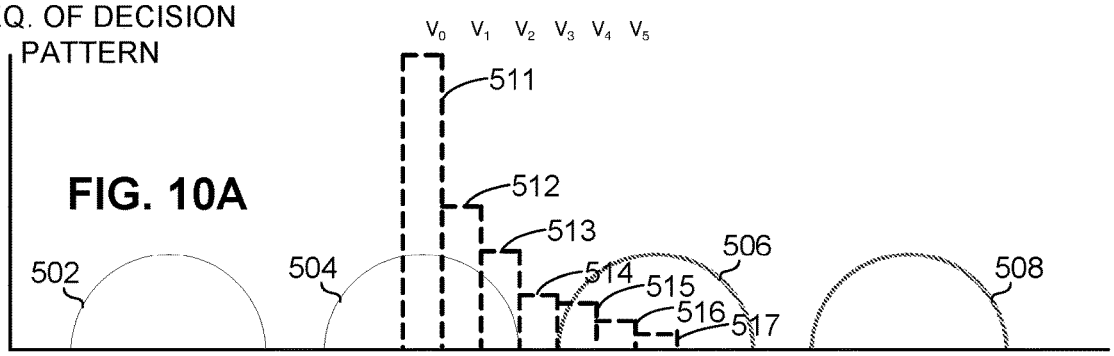
FIG. 10A is a histogram plot of frequency of decision patterns (vertical axis) as a function of reference voltage used to read a selected portion of one of the flash memory dies shown in FIG. 3 with five different reference voltages; the flash memory cells of the selected portion have been written with a 1 bit.
Figure 10B:
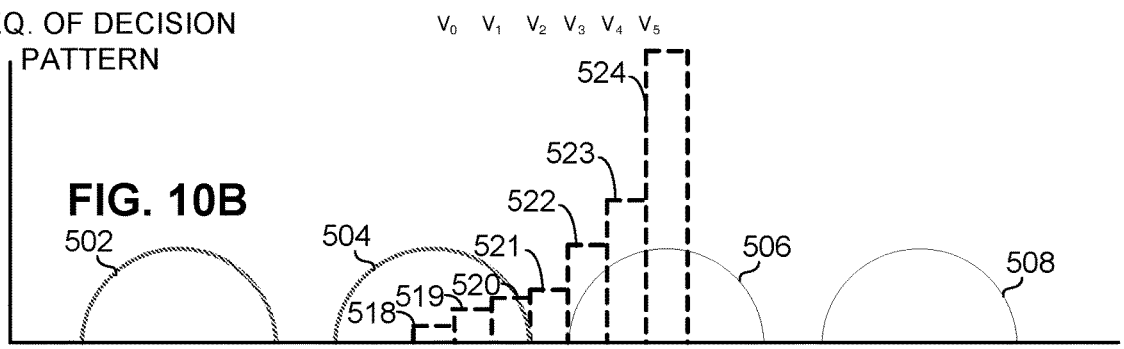
FIG. 10B is a histogram plot of frequency of decision patterns (vertical axis) as a function of reference voltage used to read a selected portion of one of the flash memory dies shown in FIG. 3 with five different reference voltages; the flash memory cells of the selected portion have been written with a 0 bit.

FIG. 10A is a histogram plot of frequency of occurrence of decision patterns (vertical axis) as a function of different reference voltages, V0 through V5, used to read a selected portion of one of the flash memory dies 194 for the flash cells of the selected portion that have been written with a 1 bit (i.e., a binary 1) of the genie bit pattern. The histogram plot of FIG. 10A is shown superimposed over a plot of flash memory cell voltage distributions 502, 504, 506 and 508. Each of the bars 511 through 517 of the histogram plot is referred to as a bin and each bin corresponds to one of the aforementioned decision regions A0 through A6, respectively. FIG. 10B is a histogram plot of frequency of occurrence of decision patterns (vertical axis) as a function of different reference voltages, V0 through V5, used to read the selected portion of one of the flash memory dies 194 for the flash cells of the selected portion that have been written with a 0 bit (i.e., a binary 0) of the genie bit pattern. The histogram plot of FIG. 10B is shown superimposed over a plot of flash memory cell voltage distributions 502, 504, 506 and 508. Each of the bars 518 through 524 of the histogram plot of FIG. 10B is a respective bin corresponding to one of the aforementioned decision regions A0 through A6, respectively.

For each bin of the histogram plots shown in FIGS. 10A and 10B, the probabilities P1 and P0 of writing the 1 bit and the 0 bit, respectively, to the selected portion of flash memory and the cell voltage falling into the corresponding decision region are given as the respective frequencies of occurrence of the decision patterns (vertical axes) plotted in FIGS. 10A and 10B, respectively, for the corresponding bin. The new LLR for the flash memory cells that produced decision patterns falling into the corresponding decision region is then calculated as the natural logarithm of P1 divided by P0: ln (P1/P0). This process is performed for each decision region (i.e., bin) of the histogram plots to determine the new LLR values for the flash memory cells that resulted in decision patterns falling into the respective decision regions. The new LLR values are stored in the LLR table 162 (FIG. 3).

Once all of the new LLR values for the selected portion of the flash memory die 194 have been determined in the manner described above, the next portion of the flash memory die 194 is selected and histogram plots such as those shown in FIGS. 10A and 10B are then constructed for the selected portion of the flash memory die 194. New LLR values are determined for the selected portion of the flash memory die 194 and stored in the LLR table 162. The process of constructing the histogram plots, determining the new LLR values for each portion from the corresponding histogram plots, and storing the new LLR values in the LLR table 162 continues until new LLR values have been determined and stored in the LLR table 162 for all or a desired number of the flash cells. This process may be performed for all of the flash memory dies 194 or it may be performed for one or more selected dies 194.

When data is subsequently read from the flash memory die 194, the location in the die 194 from which the data was read is used by the SSD controller 100 to create an index value that is then used to lookup the corresponding LLR value in the table 162. The ECC module 161 then uses the LLR value to decode the data. Because the manner in which LLR values are used in ECC decoding logic to decode read data is known, the decoding process will not be described herein in the interest of brevity.

The above-described process of generating the new LLR values typically will only be performed periodically. At lower PECs (e.g., fewer than 4,000), it has been determined that the signal-to-noise ratio (SNR) of the channel is normally sufficiently high to ensure successful decoding by the ECC module 161. Therefore, the LLR values typically will not need to be updated to new LLR values until the flash memory die 194 has undergone about 4,000 PECs. After this threshold has been reached, periodically updating the LLR values with the new values every 1,000 PECs is probably sufficient to ensure that decoding success remains high. However, the invention is not limited with respect to the threshold number of PECs before the first update occurs or with respect to the frequency with which updating occurs after the first update has occurred. Also, rather than performing the updating process periodically at fixed intervals, updating may occur based on a trigger event, such as a determination that the SNR of the channel has degraded to some extent.

Figure 11:
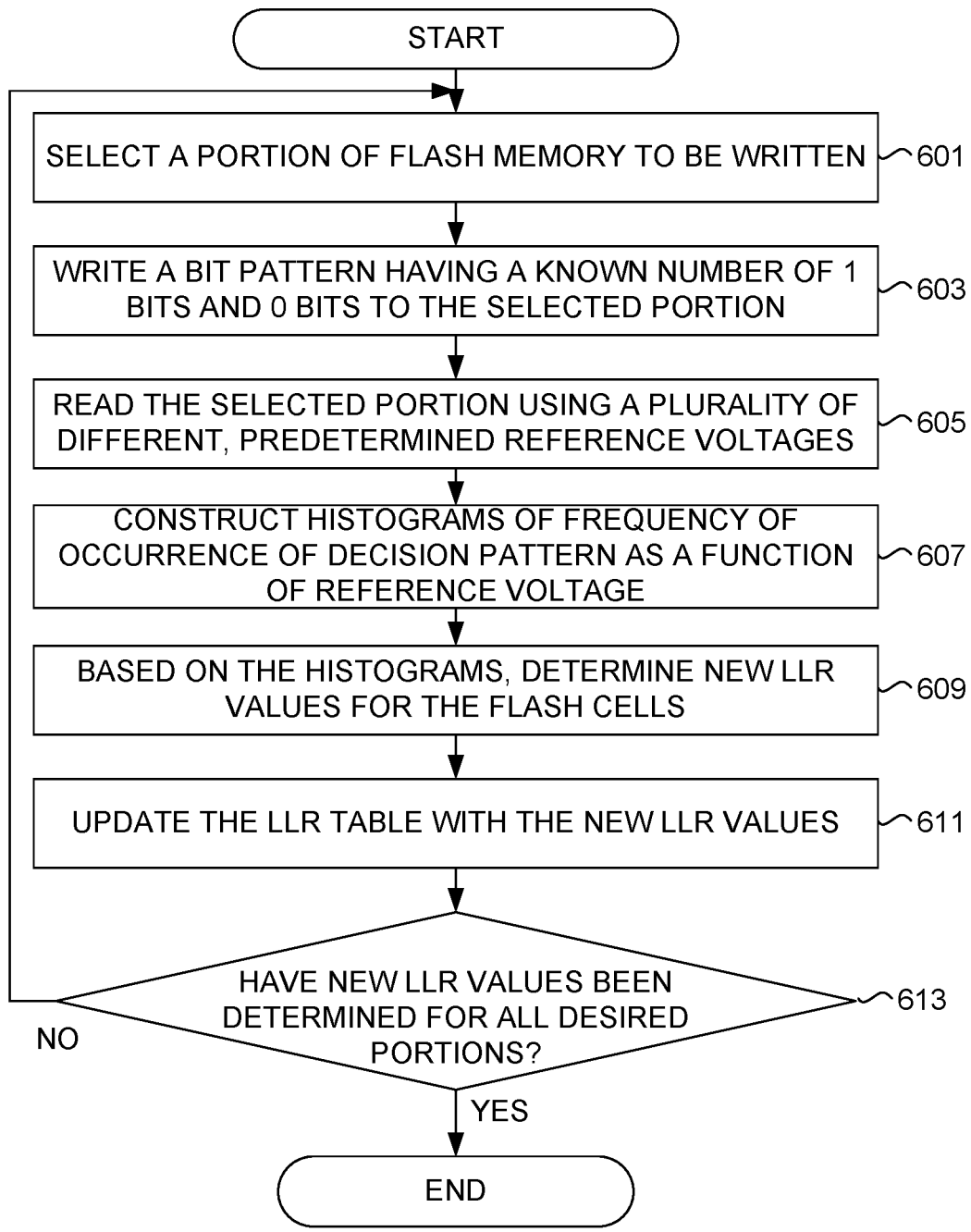
FIG. 11 is a flow diagram of the above-described method of using the histogram to determine new LLR values and of updating the LLR table with the new LLR values.

FIG. 11 is a flow diagram of the above-described method of using the histogram to determine new LLR values and of updating the LLR table 162 with the new LLR values. For exemplary purposes, it will be assumed that the program is not started until a predetermined number (e.g., 4,000) of PECs have occurred. A portion of flash memory 199 (FIG. 3) is selected for LLR updating, as indicated by block 601. For exemplary purposes it will be assumed that each selected portion comprises a block of flash memory cells of a predetermined size, although it will be understood that the selected portion may be of any size. A random bit pattern comprising a known number of 1 bits and a known number of 0 bits, sometimes referred to in the art as a genie bit pattern, is then written to the block, as indicated by block 603. The SSD controller 100 knows exactly which bits are 1 bits and 0 bits. Usually, half of the bits of the genie bit pattern are 1 bits and the other half are 0 bits.

The block is then read a predetermined number of times using different, predetermined reference voltages, as indicated by block 605. Histograms of the type shown in FIGS. 10A and 10B of decision pattern frequency as a function of reference voltage are then generated, as indicated by block 607. Based on the histograms, new LLR values are determined for the flash cells of the block in the manner described above with reference to FIGS. 10A and 10B, as indicated by block 609. The LLR table is then updated with the new LLR values, as indicated by block 611. A decision is then made at block 613 as to whether or not new LLR values have been updated for all portions of the flash memory for which updating is being performed. If so, the process ends. If not, the process returns to block 601 and the next portion of memory for which updating is to be performed is selected. The steps represented by blocks 603-613 are then performed again for the newly selected portion of memory.

Figure 12:
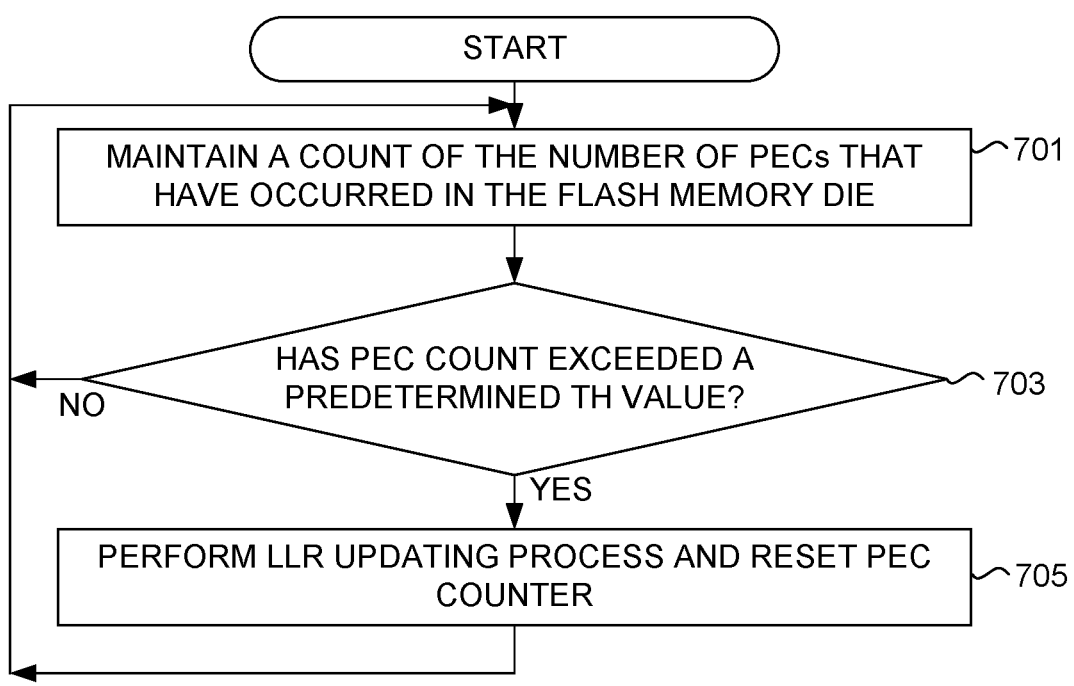
FIG. 12 is a flow diagram demonstrating an algorithm that causes the process represented by the flow diagram of FIG. 11 to be performed when a threshold number of program-and-erase cycles have occurred.

As indicated above, the updating process represented by the flow diagram of FIG. 11 is typically performed at intervals of X PECs, where X is any positive integer, but is typically at least 1,000. The updating process is typically performed when the flash memory die 194 for which LLR values are being updated is in an idle mode. FIG. 12 is a flow diagram demonstrating an algorithm that causes the process represented by the flow diagram of FIG. 11 to be performed when X PECs have occurred. The SSD controller 100 maintains a counter for each flash memory die that increments each time a PEC occurs on the respective die, as indicated by block 701. A determination is made at block 703 as to whether or not the PEC count has exceeded the threshold value. When a determination is made at block 703 that the PEC count has exceeded the threshold value, the LLR updating process represented by the flow diagram of FIG. 11 is performed and the counter is reset, as indicated by block 705.

Figure 13:
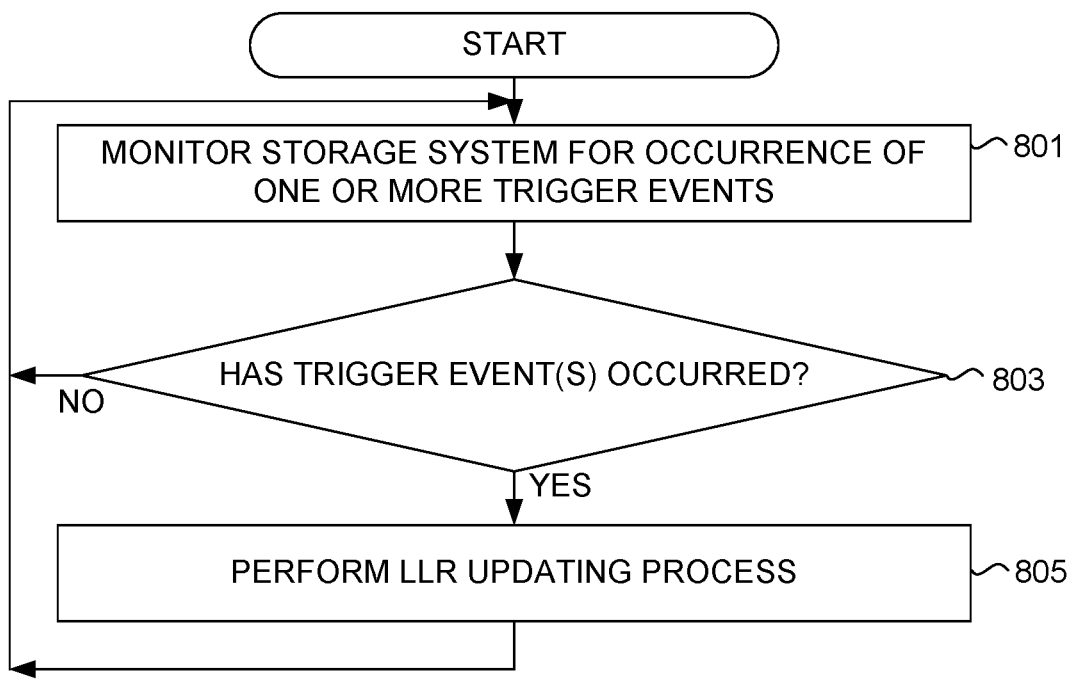
FIG. 13 is a flow diagram demonstrating an algorithm that causes the process represented by the flow diagram of FIG. 11 to be performed when a determination is made that one or more particular trigger events have occurred.

As indicated above, rather than performing the LLR updating process after the number of PECs has exceeded some threshold number, the LLR updating process may be performed when a trigger event occurs, such as detecting that the channel SNR has degraded to a particular level. FIG. 13 is a flow diagram demonstrating an algorithm that causes the process represented by the flow diagram of FIG. 11 to be performed when a determination is made that a particular trigger event has occurred. The invention is not limited with respect to the trigger event or type of trigger event that is detected. The SSD controller 100 or another component of the storage system monitors one or more aspects of the storage system to determine whether one or more trigger events have occurred, as indicated by block 801. A determination is made at block 803 as to whether or not the trigger event(s) has occurred. If a determination is made at block 803 that the trigger event has occurred, the LLR updating process represented by the flow diagram of FIG. 11 is performed and the counter is reset, as indicated by block 805.

It should be noted that the steps of performing the LLR updating process represented by blocks 705 and 805 in FIGS. 12 and 13, respectively, may be different from the process represented by the flow diagram of FIG. 11. The process represented by the flow diagram of FIG. 11 is one way of quickly and efficiently measuring new LLR values and updating the LLR table 162. However, other processes for determining new LLR values may be used to periodically update the LLR values that will be used by the ECC module 161.

It should be understood that the flow diagrams of FIGS. 11-13 are intended only to be exemplary or illustrative of the logic underlying the above-described methods. In view of the descriptions herein, persons skilled in the art readily will be capable of programming or configuring a flash memory controller or similar system in any of various ways to effect the above-described methods and similar methods. The blocks described above with regard to FIGS. 11-13 are intended only as examples, and in other embodiments the steps or acts described above and similar steps or acts can occur in any other suitable order or sequence. Steps or acts described above can be combined with others or omitted in some embodiments.

Similarly, the logic elements described above with regard to FIG. 3 are intended only as examples, and the logic underlying the above-described method can be modularized in any other suitable manner. In view of the descriptions herein, persons skilled in the art will readily be capable of programming or configuring SSD controller 100 with suitable software or in suitable logic, such as in the form of an application-specific integrated circuit (ASIC) or similar device or combination of devices, to effect the above-described method and similar methods. Also, it should be understood that the combination of software instructions or similar logic and the memory in which such software instructions or similar logic is stored or embodied in non-transitory form for execution in the CPU 171 (FIG. 3) or some other processor of the SSD controller 100 comprises a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to TLC or any other suitable type of flash memory. As will be understood by persons skilled in the art, in view of the description provided herein, many variations may be made to the embodiments described herein and all such variations are within the scope of the invention.

What is claimed is:

1. A data storage system, comprising:
   a flash memory including a set of cells for storing data in multiple storage states;
   a memory controller communicatively coupled to the flash memory, the memory controller including a processor, a log likelihood ratio (LLR) table having pre-defined values for use when decoding data read from the flash memory, the pre-defined values populated prior to performing the read, and a LLR measurement and update module including instructions that direct the memory controller to update values in the LLR table, including:
      identify a select portion of the set of cells;
      write a known pattern of the multiple storage states to the select portion of the set of cells;
      read the select portion of the set of cells k times with k different reference voltages, respectively, where k is a positive integer greater than two;
      record a respective decision pattern responsive to the storage state while applying the k different reference voltages, where each decision pattern corresponds to a decision region bordering at least one of the k different reference voltages;
      generate a new LLR value responsive to the frequency of occurrence of the respective decision patterns; and
      replace a respective value in the LLR table with the new LLR value.

2. The data storage system of claim 1, wherein the new LLR value is determined from a function of probabilities corresponding to the multiple storage states.

3. The data storage system of claim 2, wherein the function of probabilities is a ratio.

4. The data storage system of claim 2, wherein the new LLR value is determined from the natural logarithm of the probabilities corresponding to the multiple storage states.

5. The data storage system of claim 1, wherein a voltage delta between the k different reference voltages is uniform.

6. The data storage system of claim 1, wherein a voltage delta between the k different reference voltages is non-uniform.

7. The data storage system of claim 1, wherein the k different reference voltages vary from a value centered between target cell voltages.

8. The data storage system of claim 1, wherein the k different reference voltages are arranged in pairs.

9. The data storage system of claim 8, wherein a select pair of reference voltages is located between target cell voltages.

10. The data storage system of claim 1, where the memory controller is coupled to a counter that is incremented by the occurrence of a program-and-erase cycle in the flash memory.

11. The data storage system of claim 10, where the memory controller executes the LLR measurement and update module instructions periodically based on a predetermined number in the counter.

12. The data storage system of claim 11, where the predetermined number is equal to or greater than 1,000.

13. The data storage system of claim 11, where the predetermined number is equal to or greater than 4,000.

14. The data storage system of claim 1, where the memory controller executes the LLR measurement and update module instructions based on a determination by the memory controller that at least one predetermined trigger event has occurred.

15. A memory controller communicatively coupled to a flash memory, the memory controller comprising:
   a processor in communication with the flash memory;
   a log likelihood ratio (LLR) table having pre-defined values for use when decoding data read from a flash memory; and
   a LLR measurement and update module including instructions that direct the memory controller to update values in the LLR table, including:
      selectively apply a write operation to record a genie bit pattern having a known number of 0 bits and of 1 bits to a select portion of cells in the flash memory;
      read the select portion of cells k times with k different reference voltages, respectively, where k is a positive integer greater than two;
      record a respective decision pattern responsive to a storage state while applying the k different reference voltages, where each decision pattern corresponds to a corresponding decision region within a range of the different reference voltages;
      generate a new LLR value responsive to the frequency of occurrence of the respective decision patterns; and
      replace a respective value in the LLR table with the new LLR value.

16. The memory controller of claim 15, where the LLR measurement and update module instructions are executed after the flash memory detects the execution of a predetermined number of program-and-erase cycles in the flash memory.

17. The memory controller of claim 16, wherein after an initial execution of the LLR measurement and update module instructions a different predetermined number of program-and-erase cycles defines a trigger event for a subsequent execution of the LLR measurement and update module instructions.

18. The memory controller of claim 15, wherein the new LLR value is determined from the natural logarithm of a ratio of probabilities corresponding to the multiple storage states, where the probabilities are determined from the frequency of occurrences of decision patterns.

19. A method comprising:
   updating pre-stored values in a log likelihood ratio (LLR) table of a memory controller coupled to a flash memory store, the pre-defined values used when decoding read data, the updating including:
      writing a known pattern to at least a portion of the flash memory store;
      reading the portion of the flash memory store k times with k different reference voltages, respectively, where k is a positive integer that is equal to or greater than two;
      determining a decision pattern for each flash cell of the portion of the flash memory store for each respective instance of the k different reference voltages;
      using the decision patterns to record a frequency of occurrence of the decision patterns as a function of the reference voltages;
      generating a new LLR value responsive to the frequency of occurrence of the respective decision patterns; and
      replacing a respective value in the LLR table with the new LLR value.

20. The method of claim 19, wherein the method is executed periodically based on a predetermined number, NX, of program-and-erase cycles that have occurred in the flash memory store, where N is an integer greater than or equal to 1 and where X is equal to or greater than 1,000.

21. The method of claim 19, wherein a voltage delta between the k different reference voltages is uniform.

22. The method of claim 19, wherein a voltage delta between the k different reference voltages is non-uniform with at least two different reference voltages varying from a reference voltage centered between target cell voltages.

* * * * *